United States Patent [19]

Goto et al.

[11] Patent Number: 5,153,682
[45] Date of Patent: Oct. 6, 1992

[54] HEMT DEVICE WITH DOPED ACTIVE LAYER

[75] Inventors: Hideki Goto; Masanori Kato; Tatsuhiko Kawakami, all of Ushiku, Japan

[73] Assignees: Mitsubishi Monsanto Chemical Company; Mitsubishi Kasei Corporation, both of Tokyo, Japan

[21] Appl. No.: 659,487

[22] Filed: Feb. 25, 1991

Related U.S. Application Data

[63] Continuation of Ser. No. 289,337, Dec. 23, 1988, abandoned.

[30] Foreign Application Priority Data

Dec. 25, 1987 [JP] Japan ................... 2-333537

[51] Int. Cl.$^5$ ................... H01L 29/205; H01L 29/80
[52] U.S. Cl. ........................... 357/22; 357/16; 357/4
[58] Field of Search ................... 357/22, 16, 4

[56] References Cited

U.S. PATENT DOCUMENTS

| | | | |
|---|---|---|---|
| 4,663,643 | 5/1987 | Mimura | 357/22 |
| 4,755,857 | 7/1988 | Abstreiter et al. | 357/22 |
| 4,987,462 | 1/1991 | Kim et al. | 357/22 |

FOREIGN PATENT DOCUMENTS 61-237473 10/1986 Japan ................... 357/22

OTHER PUBLICATIONS

IEEE Electron Device Letters, vol. EDL-8, No. 12, Dec. 1987 Hida et al, "High-Speed ... (DMT's)" pp. 557-559.

"Advanced Processing of Semiconductor Devices" Proceedings of SPIE-The International Society for Optical Engineering, Inoue et al 25 Mar. 23-24, 1987 vol. 797.

Primary Examiner—Jerome Jackson, Jr.
Attorney, Agent, or Firm—Armstrong & Kubovcik

[57] ABSTRACT

A high-mobility semiconductor device having GaAs/AlGaAs hetero junction of the present invention comprises a GaAs active layer and a GaAs contact layer, with a high-carrier concentration AlGaAs barrier layer interposed therebetween, so that the effective carrier concentration of the active layer can be increased and thus the thickness thereof can be reduced, resulting in an increase in the trans-conductance and improvement in the high frequency characteristics. Since the presence of the AlGaAs barrier layer enables selecting etching, such element characteristics as the plane uniformity and reproducibility can be improved.

3 Claims, 3 Drawing Sheets

Fig. 1
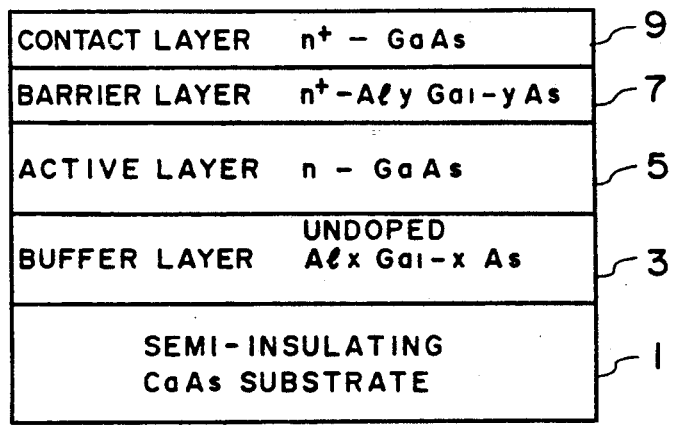
Fig. 2
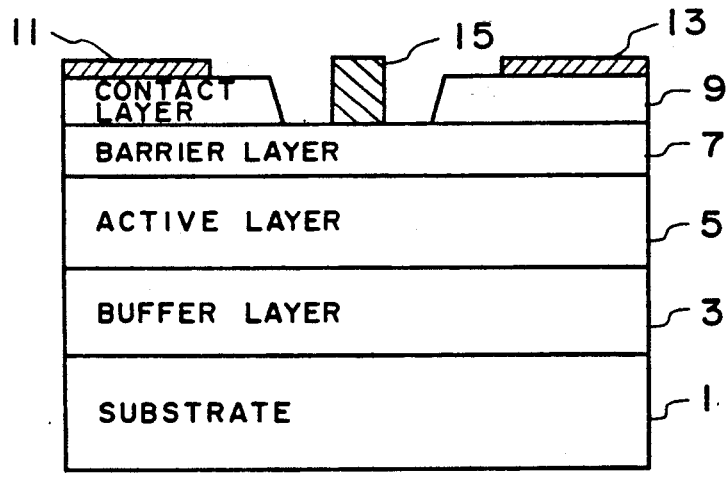
Fig. 3
|  | CARRIER CONCENTRATION ($cm^{-3}$) | THICKNESS (nm) |
|---|---|---|
| CONTACT LAYER | $1 \times 10^{18} \leq n_1^+ \leq 5 \times 10^{18}$ | $50 \leq t_1 \leq 300$ |
| BARRIER LAYER | $1 \times 10^{18} \leq n_2^+ \leq 5 \times 10^{18}$ | $5 \leq t_2 \leq 30$ |
| ACTIVE LAYER | $5 \times 10^{16} \leq n_1 \leq 2 \times 10^{18}$ | $10 \leq t_3 \leq 300$ |
| BUFFER LAYER | $n_2 \leq 1 \times 10^{15}$ | $500 \leq t_4$ |

HEMT DEVICE WITH DOPED ACTIVE LAYER

This application is a continuation of application Ser. No. 289,337 filed Dec. 23, 1988, now abandoned.

BACKGROUND OF THE INVENTION

The present invention relates to a hetero junction field effect transistor (FET), and particularly to a semiconductor device in which the recessing process is facilitated by inserting a barrier layer immediately below a gate and which enables improvement in the voltage resistance of the gate and trans-conductance.

GaAsFETs are of general interest as devices that exhibit excellent high-speed and high-frequency characteristics. Schottky gate FETs (MESFET) among this type of devices have been brought into practical use.

As shown in FIG. 6, such a MESFET comprises a buffer layer 23 and an active layer 25 which are formed on a semi-insulating GaAs substrate 21 and on which are formed a source electrode 11, a gate electrode 15 and a drain electrode 13. Both the source electrode and the drain electrode are brought into ohmic contact with the active layer 25 and the gate electrode 15 is brought into Schottky contact with the semiconductor in the active layer 25, thus producing a potential barrier which allows a depletion layer to extend in the semiconductor. The cross-sectional area of the channel is changed by controlling the thickness of the potential barrier using the gate voltage so that the current between the source and drain electrodes is controlled. The buffer layer 23 is provided for the purpose of reducing the effect of the crystallinity of the substrate.

FIG. 7 shows a high-mobility transistor (HEMT) comprising an undoped GaAs layer 33, a donor impurity-doped N-type $Al_xGa_{1-x}As$ layer 35 and a contact layer 37 which are provided in turn on a semi-insulating GaAs substrate 31. Electrons fall from the N-type $Al_xGa_{1-x}As$ layer 35 into the GaAs layer 33 to form a two-dimensional electron gas 33e in the vicinity of the hetero-junction interface which is spatially separated from the ionized donor serving as a scattering source, resulting in the achievement of high mobility owing to a reduction in the Coulomb scattering effect.

SIS (Semiconductor Insulator Semiconductor) FETs in which neither the barrier layer nor the active layer (shown in FIG. 7) are doped have also been proposed, as well as hetero junction FETs.

However, a GaAs FET such as shown in FIG. 6, as well as AlGaAs hetero buffer FETs (not shown), has the problem of exhibiting low gate voltage resistance because of the direct Schottky contact with the GaAs active layer and poor high-frequency characteristics because the trans-conductance cannot be greatly increased (for example, 1.5 dB at 12 GHz).

The HEMT shown in FIG. 7 (or reverse HEMT) also has a problem in that the concentration of the carriers flowing through the channel is limited because the active layer portion is not doped, and thus the transconductance cannot be increased.

Both ISFETs and hetero junction FETs also involve the problem that trans-conductance cannot be increased because the barrier layer and the active layer are not doped.

SUMMARY OF THE INVENTION

The present invention has been achieved with a view to solving the above-described problem.

It is an object of the present invention to facilitate the recessing process in formation of a gate electrode in a FET.

It is another object of the present invention to increase the gate voltage resistance in a FET.

It is a further object of the present invention to increase the trans-conductance in a FET.

It is still other object of the present invention to improve high frequency characteristics.

To achieve these ends, the present invention provides a high-mobility semiconductor device comprising a GaAs active layer and a GaAs contact layer, with a high-carrier concentration AlGaAs barrier layer interposed therebetween.

BRIEF DESCRIPTION OF THE DRAWINGS

FIG. 1 is a drawing of the epitaxial layer structure of the semiconductor device of the present invention;

FIG. 2 is a drawing of the structure of a device;

FIG. 3 shows the carrier concentration and the thickness of each of its layers;

DESCRIPTION OF THE PREFERRED EMBODIMENT

Figure 4:
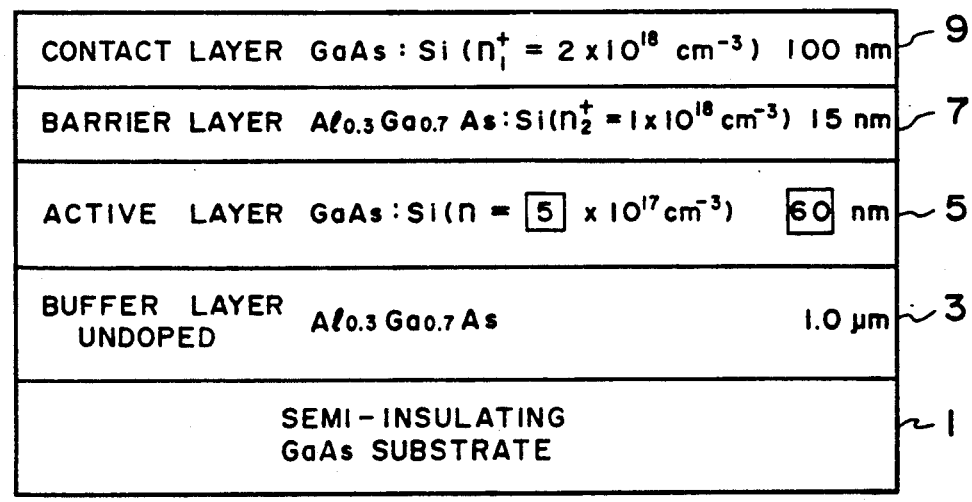
FIG. 4 is a drawing of an embodiment of the epitaxial layer structure of the semiconductor device of the present invention.

An embodiment is described below with reference to the drawings.

FIG. 1 is a drawing of the epitaxial layer structure of the semiconductor device of the present invention and FIG. 2 is a drawing of the structure of the device. In each of the drawings, reference numeral 1 denotes a semi-insulating GaAs substrate; reference numeral 3, an undoped $Al_xGa_{1-x}As$ ($0<x<0.5$) buffer layer; reference numeral 5, an n-GaAs active layer; reference numeral 7, an $n^+$-$Al_yGa_{1-y}As$ ($0.2<y<0.5$) barrier layer; reference numeral 9, a contact layer; reference numeral 11, a source electrode; reference numeral 13, a drain electrode; and reference numeral 15, a gate electrode.

In the present invention, the layers shown in FIG. 1 are respectively provided by epitaxial growth, the source electrode 11 and the drain electrode 13 being formed on the contact layer 9, and the gate electrode 15 then being formed by etching the contact layer to remove part thereof. In this case, the presence of the $Al_yGa_{1-y}As$ barrier layer 7 enables selective etching in which only the GaAs layer 9 is dissolved and thus enables the yield of the recessing process to be increased, as well as enabling improvement of the plane uniformity and reproducibility. Such selective etching may be performed either by a wet process or a dry process. Since the barrier layer 7 is doped so as to become $n^+$ type and have a high carrier concentration, electrons in the barrier layer fall into the active layer so as to increase the substantial carrier concentration of the active layer, resulting in a decrease in the thickness of the active layer and, hence, an increase in the transconductance.

Since the buffer layer 3 is not doped, the parasitic current of the buffer layer is reduced and the pinch-off characteristics are thus improved. This enables improvement of the high-frequency characteristics owing to the synergistic effect with the increase in the trans-conductance.

FIG. 3 shows a preferable carrier concentration and a preferable thickness for each of the layers of the semiconductor device of the present invention.

The contact layer 9 preferably has a carrier concentration $n_1^+$ of as high as about the $10^{18}$ cm$^{-3}$ order so as to form ohmic contact, and a thickness $t_1$ of about 50 to 300 nm which allows an electrode to be appropriately formed.

The barrier layer 7 preferably has a carrier concentration $n_2^+$ of as high as about the $10^{18}$ cm$^{-3}$ order so as to serve as an electron supply source and a thickness $t_2$ of as small as 5 to 30 nm so as to reduce the distance between the contact layer 9 and the active layer 5.

The active layer 5 preferably has a carrier concentration of about $10^{16}$ to $10^{18}$ cm$^{-3}$ and a thickness $t_3$ of 10 to 300 nm.

The buffer layer 3 preferably has a carrier concentration $n_2$ of as low as $10^{15}$ cm$^{-3}$ or less so as to reduce the parasitic current and to increase the electrical resistance, and a thickness $t_4$ of as much as about 500 nm or more so as to prevent the crystallinity of the substrate and the interface between the substrate and the buffer layer from affecting the active layer.

Figure 5:
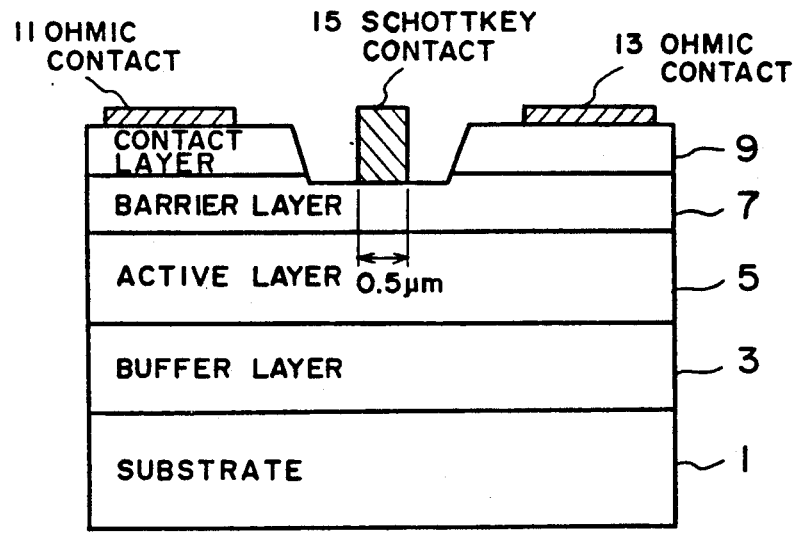
FIG. 5 is a drawing of an embodiment of the structure of the device.
Figure 6:
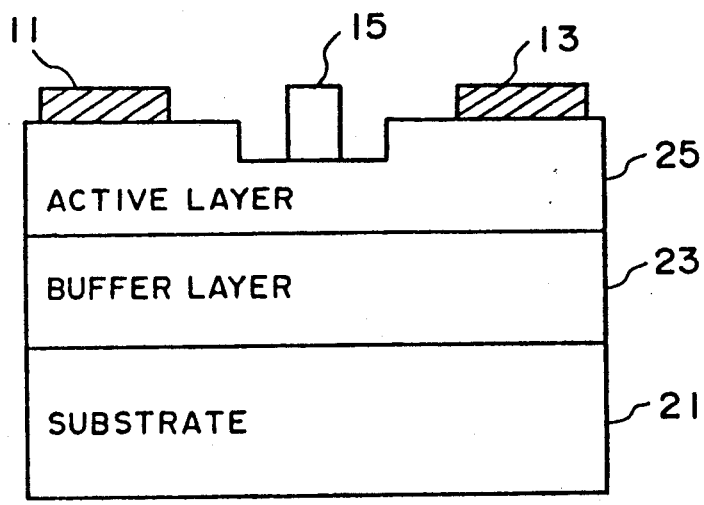
FIG. 6 is a drawing of the structure of a conventional GaAs FET.
Figure 7:
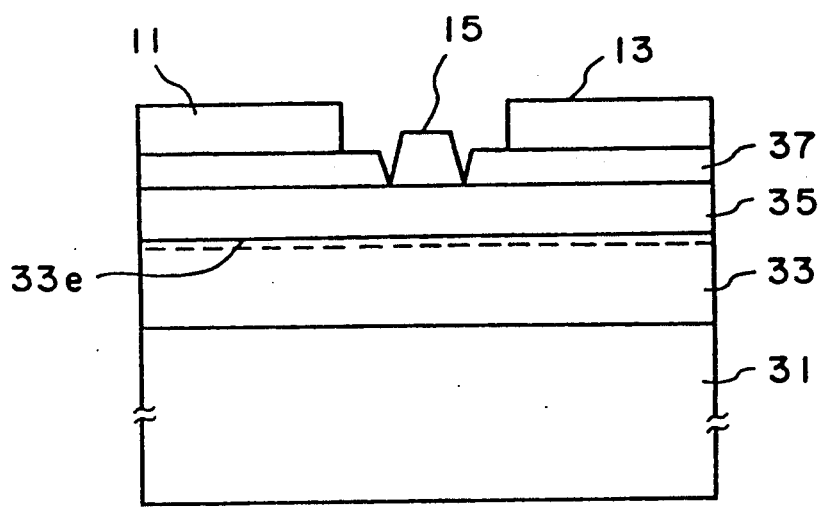
FIG. 7 is a drawing of the structure of a conventional high-mobility transistor.

FIG. 4 is a drawing of an embodiment of the structure of the epitaxial growth layer in the present invention and FIG. 5 is a drawing of an embodiment of the structure of the device.

In these embodiments, a buffer layer 3 has a composition of undoped $Al_{0.3}Ga_{0.7}As$ or GaAs and a thickness of 1.0 μm; an active layer 5 has a composition of GaAs doped with Si ($n_1 = 5 \times 10^{17}$ cm$^{-3}$) and a thickness of 60 nm; a barrier layer 7 has a composition of $Al_{0.3}Ga_{0.7}As$ doped with Si ($n_2^+ = 1 \times 10^{18}$ cm$^{-3}$) and a thickness of 15 nm; and a contact layer 9 has a composition of GaAs doped with Si ($n_1^+ = 2 \times 10^{18}$ cm$^{-3}$) and a thickness of 100 nm. A gate electrode is an Al electrode having a length of 0.5 μm and each of th source and drain electrodes has a three-layer structure of AuGe/Ni/Au.

Such a structure exhibits element characteristics wherein the threshold voltage $V_{th} = -2.0$ V, conductance $g_m = 500$ mS/mm, the noise figure NF = 1.0 dB (at 18 GHz), and gate voltage resistance $V_{GMAX} = +1.2$V, with a margin of error of ±2% in a substrate surface of 2 inch φ.

As described above, the present invention is capable of achieving the following effects:

(1) Although the gate of the present invention has a recess structure in the same manner as in a conventional GaAs FET or hetero buffer FET, the $n^+$-$Al_yGa_{1-y}As$ barrier layer enables selective etching, leading to remarkable improvement in such element characteristics as the uniformity of the plane and reproducibility.

(2) Since the barrier layer is doped so as to become the $n^+$ type, the effective carrier concentration of the active layer can be further increased on the same principle as that of HEMT and the thickness of the active layer can thus be reduced, resulting in an increase in the trans-conductance.

(3) In the case of the buffer layer composed of undoped $Al_xGa_{1-x}As$ ($x \neq 0$), the pinch-off characteristics can be improved and, hence, the high frequency characteristics can be improved too owing to the synergistic effect with the increase in the trans-conductance.

What we claim is:

1. A high mobility semiconductor device having an heterojunction and comprising:
   a doped GaAs active layer having a thickness of 10 to 300 nm formed on a semi-insulating GaAs substrate through a buffer layer selected from the group consisting of GaAs and AlGaAs;
   a high-carrier concentration AlGaAs barrier having a thickness of 5 to 30 nm formed on said GaAs active layer; and
   a GaAs contact layer having a thickness of 100 to 200 nm formed on said AlGaAs barrier.

2. A semiconductor device according to claim 1, wherein said barrier layer has a carrier concentration of $1 \times 10^{18}$ to $5 \times 10^{18}$ cm$^{-3}$.

3. A semiconductor device according to claim 1, wherein said active layer has a carrier concentration of $5 \times 10^{16}$ to $1 \times 10^{18}$ cm$^{-3}$.

* * * * *